United States Patent
Weinberg (10) Patent No.: US 10,908,240 B2
(45) Date of Patent: Feb. 2, 2021

(54) METHOD FOR ACQUIRING AN IMAGE AND MANIPULATING OBJECTS WITH MAGNETIC GRADIENTS PRODUCED BY ONE OR MORE ELECTROPERMANENT MAGNET ARRAYS

(71) Applicant: Weinberg Medical Physics, Inc., North Bethesda, MD (US)

(72) Inventor: Irving N. Weinberg, North Bethesda, MD (US)

(73) Assignee: Weinberg Medical Physics, Inc.

( * ) Notice: Subject to any disclaimer, the term of this patent is extended or adjusted under 35 U.S.C. 154(b) by 41 days.

(21) Appl. No.: 16/448,915

(22) Filed: Jun. 21, 2019

(65) Prior Publication Data

US 2019/0391217 A1 Dec. 26, 2019

Related U.S. Application Data

(60) Provisional application No. 62/688,568, filed on Jun. 22, 2018.

(51) Int. Cl.
*G01R 33/383* (2006.01)
*G01R 33/54* (2006.01)

(52) U.S. Cl.
CPC ......... *G01R 33/383* (2013.01); *G01R 33/543* (2013.01)

(58) Field of Classification Search
CPC G01R 33/383; G01R 33/543; G01R 33/4833; G01R 33/385; G01R 33/381; A61B 5/055
See application file for complete search history.

(56) References Cited

U.S. PATENT DOCUMENTS

| | | | | |
|---|---|---|---|---|
| 2009/0278535 A1* | 11/2009 | Takizawa | ............... | A61B 5/055 324/309 |
| 2018/0055414 A1* | 3/2018 | Bieri | ...................... | A61B 5/055 |
| 2019/0212406 A1* | 7/2019 | Meineke | .............. | G01R 33/243 |

\* cited by examiner

*Primary Examiner* — Susan S Lee
(74) *Attorney, Agent, or Firm* — Barnes & Thornburg LLP (57) ABSTRACT

An apparatus and method create or modify a magnetic field in a region of interest and utilize a plurality of electropermanent magnets configured to perform both the action of establishing a quasi-static magnetic field, and the action of imposing transient magnetic non-uniformity.

18 Claims, 6 Drawing Sheets

METHOD FOR ACQUIRING AN IMAGE AND MANIPULATING OBJECTS WITH MAGNETIC GRADIENTS PRODUCED BY ONE OR MORE ELECTROPERMANENT MAGNET ARRAYS

CROSS REFERENCE AND PRIORITY

This patent application claims priority to U.S. Provisional Patent Application Ser. No. 62/688,568, entitled "Method for Acquiring an Image and Manipulating Objects with Magnetic Gradients Produced by One or More Electropermanent magnet arrays," filed Jun. 22, 2018, the disclosure of which being incorporated herein by reference in its entirety.

FIELD

Disclosed embodiment provide a method and apparatus for imaging of humans and other animate and inanimate objects, and treatment of humans and other animals.

BACKGROUND

Electropermanent magnets may be used to establish net magnetization in a sample, thereby assisting in the image generation process for Magnetic Resonance Imaging (MRI). In conventional MRI systems, permanent magnets or superconducting coil magnets are used to establish a net magnetization in a sample. Electrically-activated magnetic gradient coils are used to impose transient magnetic non-uniformity on the sample, which is critical to the image generation process because the magnetic gradient establishes a relationship between spatial position and magnetic field strength and direction.

SUMMARY

Disclosed embodiments provide an apparatus and method for creating or modifying a magnetic field in a region of interest comprising a plurality of electropermanent magnets configured to perform both the action of establishing a quasi-static magnetic field, and the action of imposing transient magnetic non-uniformity.

BRIEF DESCRIPTION OF THE FIGURES

The detailed description particularly refers to the accompanying figures in which.

DETAILED DESCRIPTION

As explained above, electropermanent magnets may be used to establish net magnetization in a sample to be imaged, thereby assisting in the image generation process for MRI. It is critical to the image generation process to impose transient magnetic non-uniformity on the sample on the sample using electrically-activated magnetic gradient coils. This is because the magnetic gradient establishes a relationship between spatial position and magnetic field strength and direction.

Figure 1:
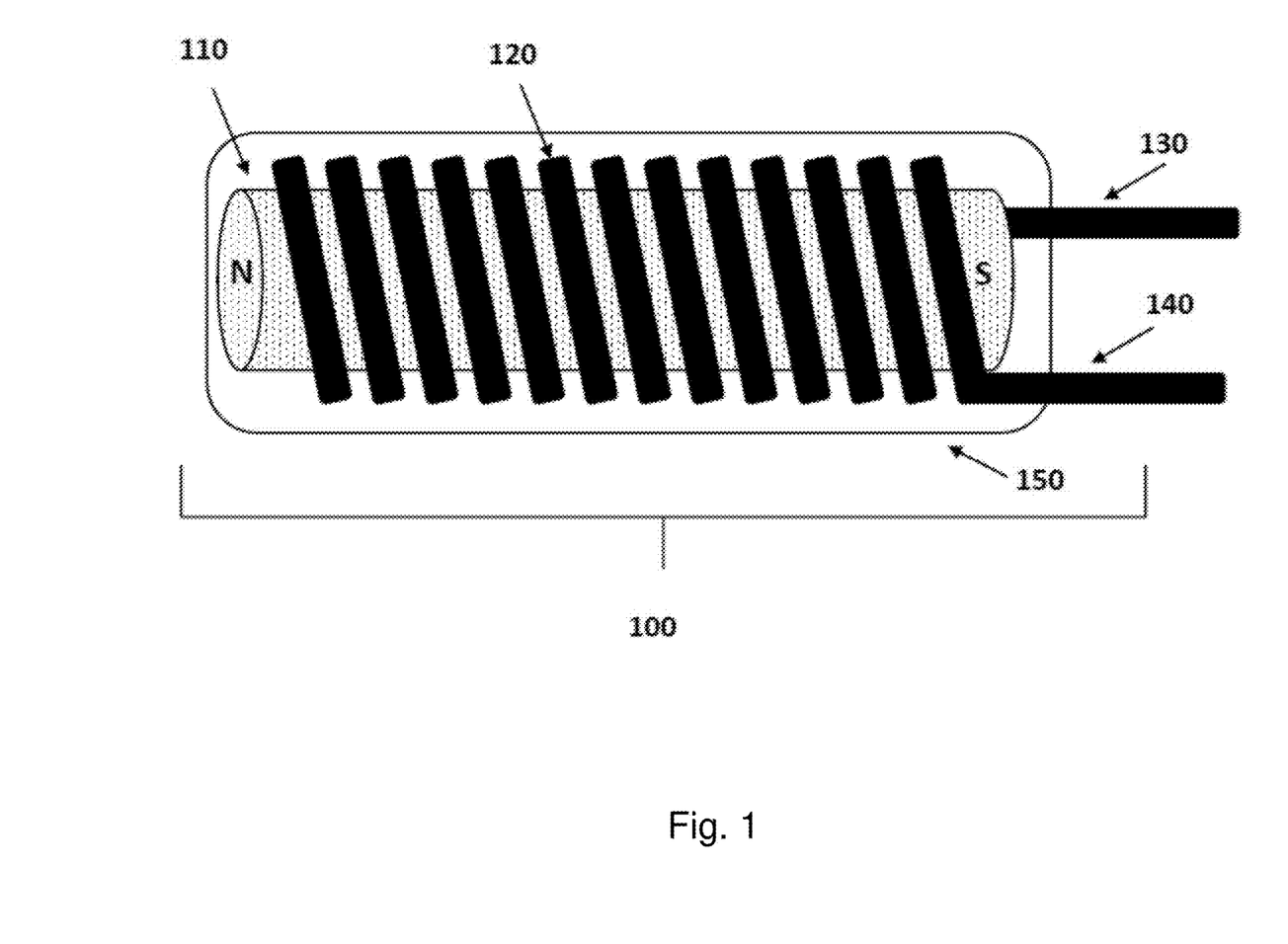
FIG. 1 illustrates an example of a foundation element for the disclosed embodiments which includes one or more magnetizable materials whose magnetization can be changed.

Disclosed embodiments provide an apparatus and method for applying magnetic gradients for the purposes of imaging and image-guided therapy. As shown in FIG. 1, disclosed embodiments utilize a foundation element 100 which may considered a building block of the disclosed embodiments and includes one or more magnetizable materials 110 whose magnetization can be changed. Such changes may include, for example, changes in magnetization magnitude, changes in magnetization polarization direction, and complete nullification of magnetization in the magnetizable material 110.

The foundation element 100 may conceptually be thought of as the building block for the disclosed apparatus and may be also be referred to herein as an "electropermanent magnet." For the purposes of this specification disclosure, the term "electropermanent magnets" are defined as electrically conductive and magnetizable components and/or materials that retain substantial (for example, 10% of maximal) magnetization after current has ceased in the electrically conductive component. Further, for the purposes of this specification disclosure, the term "electrically conductive" includes electrically conductive and superconductive materials.

In FIG. 1, the magnetization of the one or more magnetizable materials 110 is produced or otherwise modified by a coil 120, with electrical leads 130 and 140 that are connected to one or more generators of electrical voltage or current (not shown) which is in turn controlled by a computer (also not shown). Coil 120 and magnetizable material 110 may be enclosed within a shield 150. It should be understood that, once the magnetizable material 110 is magnetized, the material constitutes a "magnet," thus, the letters N and S included in FIG. 1 are placed on magnetizable material 110 to represent an example of a magnetic orientation, i.e. magnetic north and magnetic south, present after the material has been magnetized by supplying a current through coil 120 via electrical leads 130 and 140.

In accordance with this disclosure of inventive and technical utility, it should be understood that the term "magnetizable material" refers to material that may contain substances with different coercivity and magnetic and electric properties, for example, hard and soft magnets and piezoelectric and magnetoelectric and ferroelectric materials. It should also be understood that these materials may be arranged concentrically within the magnetizable material 110, may be arranged longitudinally along the magnetizable material 110, may be arranged diametrically along the magnet diameter, may be dispersed evenly or unevenly throughout the magnet, or may be arranged in any combination of the aforementioned orderings.

For example, the magnetizable material 110 may be implemented as a cylindrical or square rod of AlNiCo alloy, or NdFeB alloy. The magnetization of magnetizable material 110 may be altered through application of an electrical current through wire coil 120 including leads 130 and 140.

In accordance with this disclosure of inventive and technical utility, it should be understood that coil 120 may have configurations other than simple windings, for example coil, windings in separate directions (as might be useful for shielding) or may be non-uniform (as in a "fingerprint" pattern").

In accordance with this disclosure of inventive and technical utility, it should be understood that the electrical current may be applied through a current or voltage source (understood to be included but not shown in FIG. 1). It should further be understood that this electrical current may be under control of a computer (that is also not illustrated in FIG. 1 but understood to be present). Further, it should be understood that the current direction, amplitude, duration, frequency, and duty cycle can all be adjusted with high resolution.

As shown in FIG. 1, a cover 150 may be positioned to shield other elements included in the foundation element 100 from the electrical and/or magnetic component of electromagnetic waves generated by the coil 120. Additionally, or alternatively the cover 150 may shield coil 120 from other coils in the vicinity of the foundation element (for example, a radiofrequency coil understood to be present but which is not shown in FIG. 1).

In accordance with this disclosure of inventive and technical utility, it should be understood that the magnetization state of magnetizable material 110 may be altered through other means than an electrical coil 120. For example, if the material 110 is magnetoelectric, the application of a voltage to magnetizable material 110 may be used to alter the magnetization of magnetizable material 110.

Figure 2:
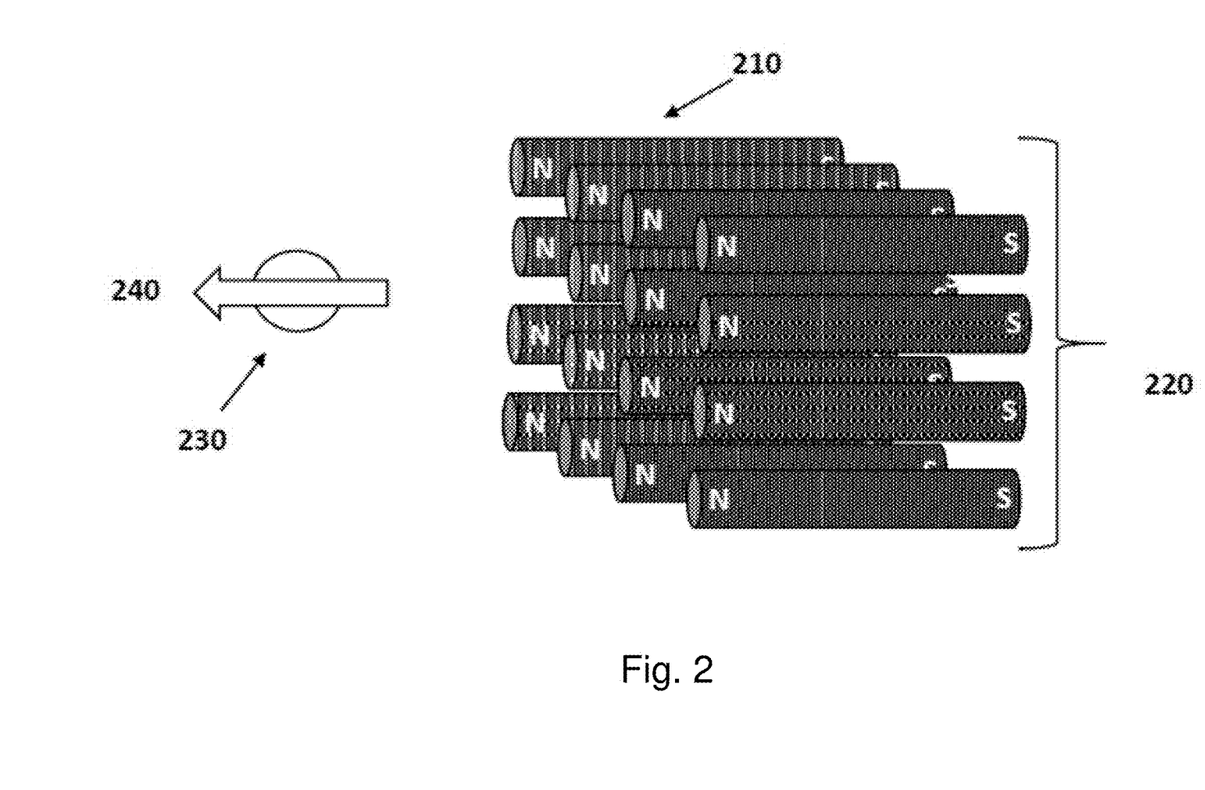
FIG. 2 shows a plurality of electropermanent magnets placed in a two-dimensional array adjacent to a field-of-view in accordance with disclosed embodiments.

FIG. 2 illustrates how the foundation element 100, now magnetized so as to be electropermanent magnets 210, may be configured into one or more electropermanent magnet arrays 220 near a field of view 230 that may include an object or material to be imaged. Thus, as illustrated in FIG. 2, all of the electropermanent magnets 210 may be magnetized in the same direction, thereby imposing a magnetic field on the sample 210 which has a resultant magnetization 240. More specifically, FIG. 2 illustrates the two-dimensional array 220 of electropermanent magnets 210 adjacent to a field-of-view 230 containing protons or other magnetizable particles of interest (for example, electrons, nitrogen atoms, iron-containing particles). It is understood that the particles may be incorporated into tissues (living or otherwise) or into other bulk forms (for example solids or liquids).

It should be understood that, for the purposes of this disclosure, all types of magnetizable particles may be referred to as "protons," but it should be understood that the same imaging, moving, propelling, rotating and/or actuating operations described herein would apply to other types of magnetizable particles as described above. Although the electrical leads to each electropermanent magnets are not shown, it should be understood that the leads are present. As indicated by N and S on the electropermanent magnets 210, all the electropermanent magnets have been magnetized in one direction, which creates a net magnetization vector in protons residing in the Field-Of-View (FOV) 240. In accordance with this disclosure of inventive and technical utility, it should be understood that the term field-of-view (or FOV) means a region of space that is of interest to a user (for example a physician wishing to discern disease in a patient, or an inspector of fruit wishing to detect unwanted contaminants).

This net magnetization 240 of object 230 may be useful for magnetic resonance imaging, acting as the quasi-static magnetic field as described in US Pat. Pub. 20170227617 by inventors Irving Weinberg and Aleksandar Nacev, entitled "Method and Apparatus for Manipulating Electropermanent Magnets for Magnetic Resonance Imaging and Image Guided Therapy," incorporated by reference herein.

The uniformity of the quasi-static magnetic field may be improved through the successive application of currents through the coils surrounding the electropermanent magnets 210, where the uniformity is measured using a magnetometer in the FOV or by measuring the line-width of a free-induction decay or other signal from protons in the FOV.

Figure 3:
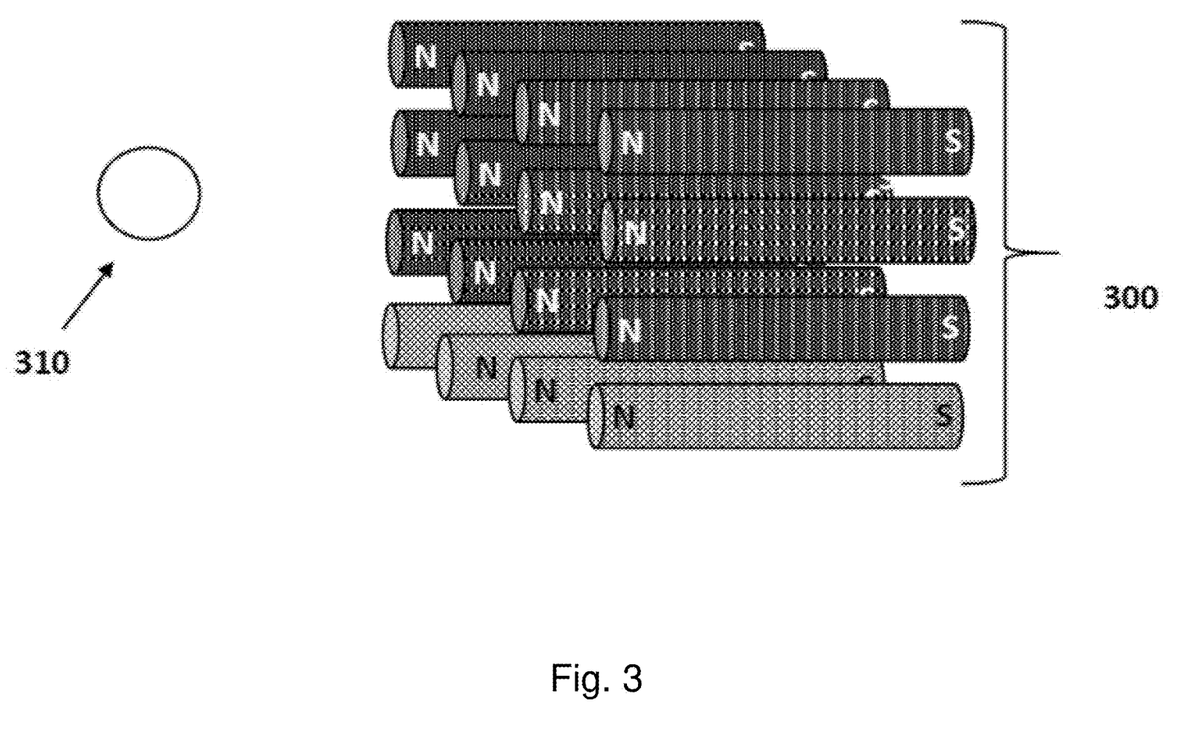
FIG. 3 shows the plurality of electropermanent magnets in the two-dimensional array of FIG. 2, wherein one row of the electropermanent magnet array has been de-magnetized after having been subjected to an electrical current, thereby imposing non-uniformity on the magnetic field experienced by protons in field-of-view in accordance with the disclosed embodiments.

The MR image reconstruction process for objects in a FOV is well-known when the transient magnetic gradients are created by coils. The application of electropermanent magnets to create transient magnetic gradients was anticipated in US 20170227617 (for example, paragraph 37). The presently disclosed innovation represents additional refinement of that inventive concept as explained herein. FIG. 3 illustrates a transient state of the electropermanent magnet array 300 in which the magnetization of one row of the electropermanent magnets has been transiently changed to a value different than the other rows, thereby establishing a magnetic gradient across the FOV 310 that can be used to assist in collecting data needed to reconstruct an image of an object in the FOV 310.

Thus, FIG. 3 shows array 300, which may be considered the same configuration as the array 220 of FIG. 2 but where one row of the electropermanent magnet array has been de-magnetized after having been subjected to an electrical current, thereby imposing non-uniformity on the magnetic field experienced by protons in FOV 310.

Figure 4:
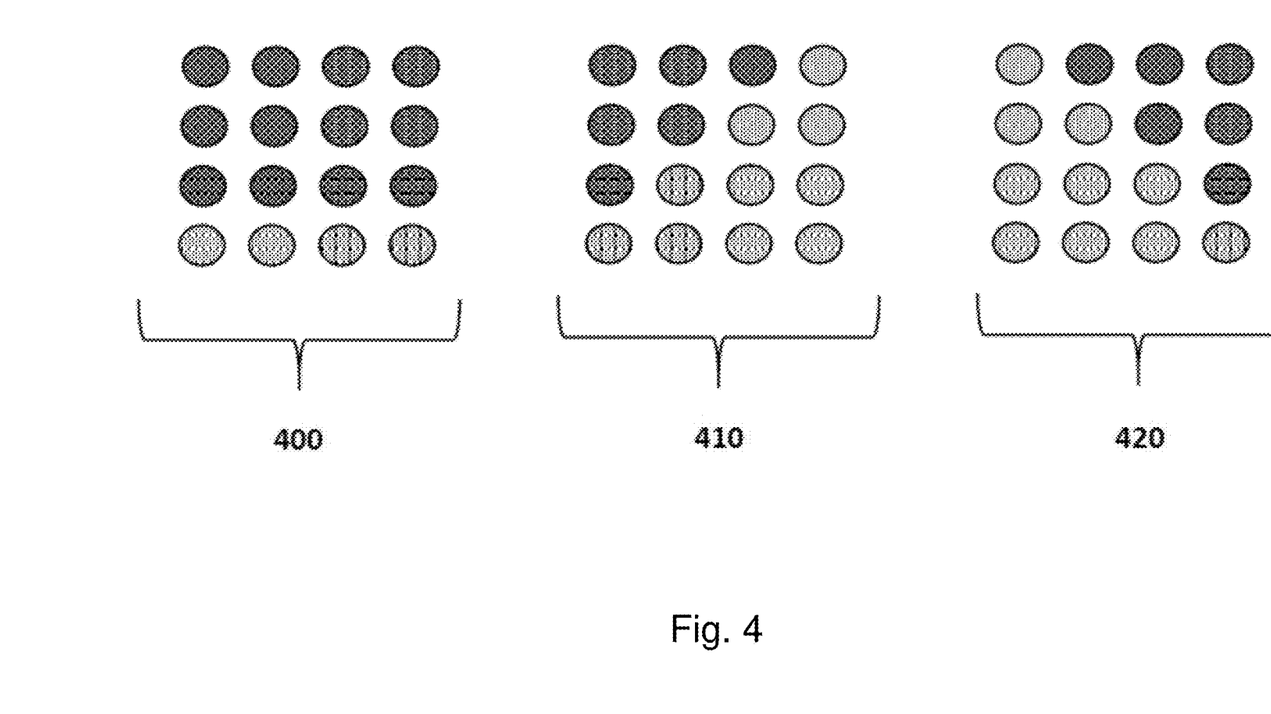
FIG. 4 is an end-on-view of the array of FIGS. 2 and 3, wherein the array is in various magnetization states in accordance with the disclosed embodiments.

FIG. 4 is an en-face view of the array 300 of FIG. 3, after the magnetization of certain electropermanent magnets have been modified. Thus, it should be understood that multiple arrays 300 could be placed near (for example, within a meter) a FOV. Thus, FIG. 4 shows how the magnetic configuration of electropermanent magnet arrays 400, 410, and 420 can be modified to represent members of a basis set that may be used to result in the application of generalized gradients on a nearby FOV (not shown). FIG. 4 is an end-on-view of the array 220 in various magnetization states, including state 400 that is equivalent to the array 300 of FIG. 3, and states 410 and 420. It should be understood that many magnetization states can be realized, including states where one or more of the electropermanent magnets are polarized in an opposite direction to other ones, as well as including states where one or more of the electropermanent magnets are polarized so as to have no net magnetization or reduced magnetization. It should also be understood that the magnetization states of the arrays may impose non-uniform gradients on protons in a nearby FOV (not shown).

Technical utility of the present innovation results from the ability to create or modify a magnetic field in the FOV by using the electropermanent magnet array to perform both the action of establishing a quasi-static magnetic field, and the action of imposing transient magnetic non-uniformity.

In conventional MRI, the magnitude of the magnetic field across the FOV created by gradient coils varies linearly with position across the FOV in all three directions. Unlike conventional MRI, the magnetic gradients produced in accordance with disclosed embodiments can be non-linear. Furthermore, the gradient non-linearity may be implemented in any or all of three directions.

As a result, for example, the disclosed embodiments may be used to provide non-linear basis sets in imaging fields, other than MRI, for example, coded apertures. The non-linear bases may be used improve the orthogonality of the members of the basis set. An orthogonal basis set can be used in MRI to more efficiently encode spatial information required to reconstruct an image, as is appreciated in the sub-field of compressed sensing.

Figure 5:
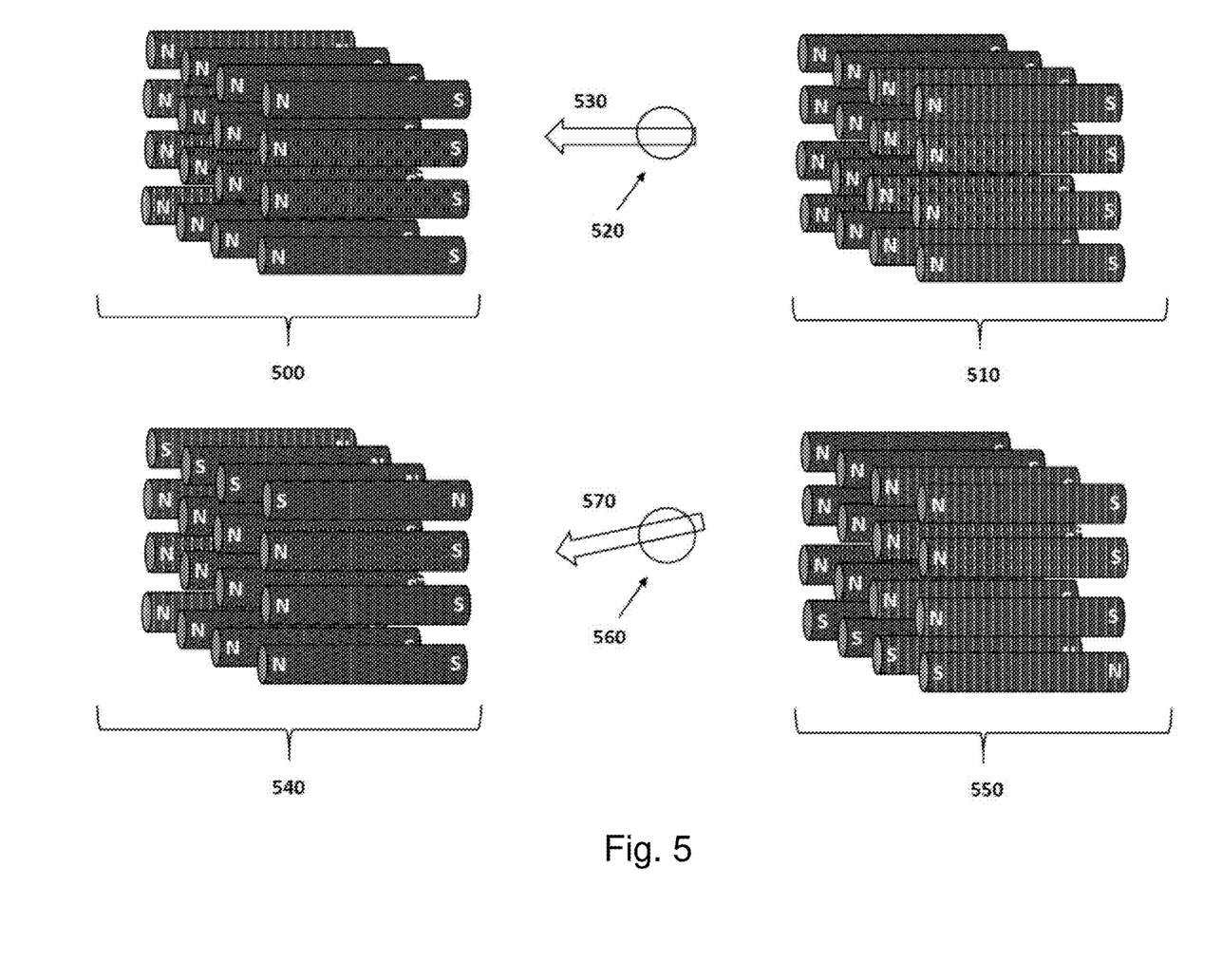
FIG. 5 illustrates an example in which a magnetization of two sets of electropermanent magnet arrays initially impose magnetic fields on a sample resulting in a net magnetization in accordance with disclosed embodiments.

Accordingly, FIG. 5 illustrates a configuration of two electropermanent magnet arrays 500 and 510 in a state that establishes a magnetization vector 530 in an object placed in the field-of-view 520. Thus, FIG. 5 illustrates how elements of the electropermanent magnet arrays 500 and 510 can be transiently changed to the states 540 and 550 (respectively) to implement a re-orientation (or "tipping") of the magnetization vector of an object in FOV 560 from its prior state 530 to the new state 570. It should be appreciated that this re-orientation might replace the need for radiofrequency reorientation of the proton magnetization vector in a pulse sequence for magnetic resonance imaging. Reducing radiofrequency deposition in a body is generally preferred by regulatory authorities.

Thus, as shown in FIG. 5, the magnetization of two sets of electropermanent magnet arrays 500, 510 initially impose magnetic fields on a sample in the FOV 520, resulting in a net magnetization 530. At a later time, the electropermanent magnets on one row of each of the sets 500 and 510 may be reversed to the configurations 540 and 550, respectively. That reversal may be accomplished via the application of a current through the coil, the current being sent in a direction so as to generate a magnetic field opposite to the existing magnetic field in the magnetizable material. The application of such current and consequent reversal of the electropermanent magnet polarity in certain rows causes the net magnetization 570 in a sample in FOV 560 to tip with respect to its prior orientation 520.

Figure 6:
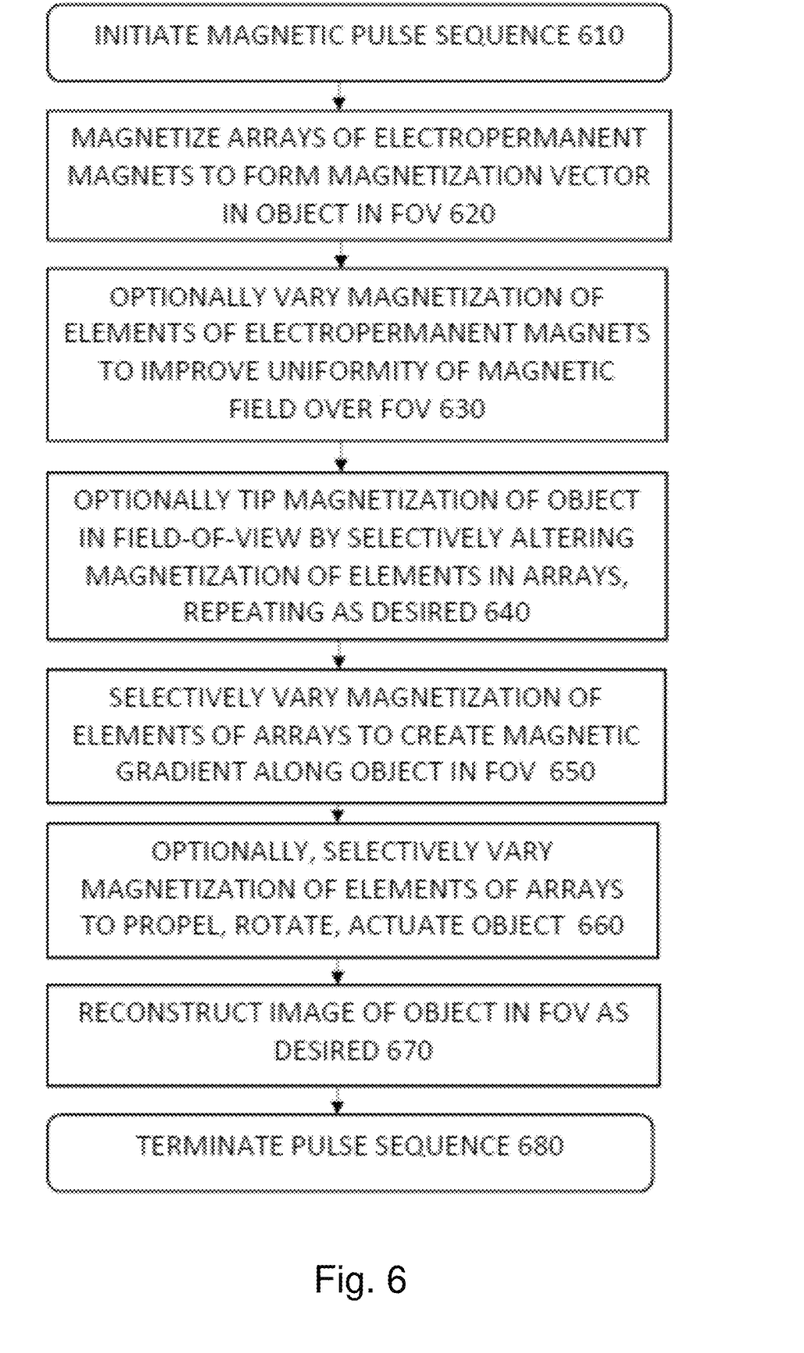
FIG. 6 is a flow-chart illustrating a method of imaging and optionally directing therapy in accordance with disclosed embodiments.

FIG. 6 is a flow-chart of a method provided in accordance with disclosed embodiments for imaging and optionally directing therapy. As shown in FIG. 6, the method may begin by initiating a pulse-sequence at 610, as is common practice in the MRI field, however it should also be understood that additional operations (for example, positioning an object— e.g., a patient or part of a patient—in the FOV, administering magnetic particles to the patient, etc.) may precede or follow the initiation of the pulse sequence. Control then proceeds to 620, at which arrays of electropermanent magnets may be energized to create a magnetic field B0 within a FOV, which produces a net magnetization (M) in an object within the FOV. Here, it should be understood that energizing an electromagnet involves sending current through a coil (e.g., coil 120 illustrated in FIG. 1 or the like which is wound around the magnetizable material 110).

In accordance with disclosed embodiments, it should be understood that the magnetic field B0 may be relatively uniform (for example, several parts per million, as might be the case for a double-sided array) or relatively non-uniform (as might be the case for a single-sided array). Control then proceeds to 630 at which the magnetization of the selected electropermanent elements of the arrays may be varied to improve uniformity or other desirable attributes of B0. This variation may be performed successively after measurement of B0 (for example, with a magnetometer) as may be well known through optimization schemes (for example, Newton-based optimization).

In accordance with disclosed embodiments, it should be understood that operations performed at 630 may (optionally) precede those performed at 620, and that a repeat of the operations at 620 may occur after operations at 630. Subsequently, operations at 640 may be performed wherein the magnetization of selected electropermanent elements in the arrays may be varied to transiently tip the magnetization vector (M) to an angle that is different from the prior B0. Thereafter, control may proceed to 650 at which the magnetization of selected electropermanent elements of the arrays may be varied to create magnetic gradients within the FOV that encode M with information that would be useful in reconstructing an image of objects in the FOV. Subsequently, control proceeds to 660 at which the magnetization of selected electropermanent elements of the arrays may be varied to create magnetic gradients within the FOV for propulsion, rotation, or other activation (for example, heating or drug release) of objects in the FOV.

Control then proceeds to 670, at which data collected from one or more objects in the FOV may be used to reconstruct an image of said objects. The data may be collected using an antenna sensitive to radiofrequency emissions from objects in the FOV.

In accordance with at least some disclosed embodiments, it should be understood that the operations 650, 660, and 670 may be repeated in various sequences to achieve image-guided therapy.

In accordance with disclosed embodiments, it should be understood that the static field may be set to zero during operations at 660 to provide additional degrees-of-freedom for moving or actuating objects in the FOV. Further, it should be understood that the FOV may vary along the pulse sequence by selecting frequencies of excitation with radiofrequency energy or with alterations of the magnetic gradient profile or both. Likewise, it should be understood that the rate of change of the magnetic field may be fast enough so as to eliminate or reduce discomfort from peripheral nerve stimulation, as described in U.S. Pat. No. 8,466,680 entitled "Apparatus and Method for Decreasing Bio-effects of Magnetic Fields" and patents and patent applications related thereto by priority and incorporation by reference (hereby incorporated by reference in their entireties).

It should be further understood that the term "object" may include human and other animate creatures as well as inanimate structures, including magnetizable particles or tools.

It should be understood that use of the disclosed embodiments may obviate the need for one or more magnetic gradient coils to image or move or actuate an object in the FOV.

Additionally, it should be understood that one or more radiofrequency antennas may be added to the configuration described herein in order to generate or collect electromagnetic radiation or magnetic radiation from the object in the FOV.

In accordance with this disclosure of inventive and technical utility, it should be understood that the changes in magnetization of the electropermanent magnets may be rapid (for example, microseconds) or may be slow (for example, milliseconds), and that the evolution of the magnetization in the object may be similarly slow or fast. In the case of rapid magnetization changes in the object, reconstruction methods such as spiral imaging may be used.

In accordance with this disclosure of inventive and technical utility, it should be understood that the action of the assemblies is under the control of a computer, and may be autonomously targeted to one or more targets on the basis of the magnetic resonance images of the body part and targets.

More specifically, it should be understood that the operations explained herein may be implemented in conjunction with, or under the control of, one or more general purpose computers running software algorithms to provide the presently disclosed functionality and turning those computers into specific purpose computers.

Moreover, those skilled in the art will recognize, upon consideration of the above teachings, that the above exemplary embodiments may be based upon use of one or more programmed processors programmed with a suitable computer program. However, the disclosed embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

Moreover, it should be understood that control and cooperation of the above-described components may be provided using software instructions that may be stored in a tangible, non-transitory storage device such as a non-transitory computer readable storage device storing instructions which, when executed on one or more programmed processors, carry out the above-described method operations and resulting functionality. In this case, the term non-transitory is intended to preclude transmitted signals and propagating waves, but not storage devices that are erasable or dependent upon power sources to retain information.

Those skilled in the art will appreciate, upon consideration of the above teachings, that the program operations and processes and associated data used to implement certain of the embodiments described above can be implemented using disc storage as well as other forms of storage devices including, but not limited to non-transitory storage media (where non-transitory is intended only to preclude propagating signals and not signals which are transitory in that they are erased by removal of power or explicit acts of erasure) such as for example Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies without departing from certain embodiments. Such alternative storage devices should be considered equivalents.

While certain illustrative embodiments have been described, it is evident that many alternatives, modifications, permutations and variations will become apparent to those skilled in the art in light of the foregoing description. Accordingly, the various embodiments of, as set forth above, are intended to be illustrative, not limiting. Various changes may be made without departing from the spirit and scope of the invention.

The invention claimed is:

1. An apparatus for imaging one or more objects in a field-of-view, wherein the apparatus comprises:
    at least one array containing at least two electropermanent magnets; and
    a controller for controlling generation of magnetic fields by the at least one array,
    wherein a magnetic configuration of the array may be varied to produce magnetic profiles in the field-of-view that constitute a basis set for reconstructing an image of the object.

2. The apparatus of claim 1, wherein at least some members of the basis set are orthogonal one another.

3. The apparatus of claim 1, wherein at least one of the magnetic profiles is non-linear with position along any direction within the field-of-view.

4. The apparatus of claim 1, wherein the magnetic profiles propel, rotate or actuate at least one object in the field-of-view.

5. The apparatus of claim 1, wherein the magnetic profiles are used to alter the direction of magnetization of the object.

6. The apparatus of claim 1 wherein measurement of the magnetic profile in the field-of-view is used to select magnetization of electropermanent magnets in the at least one array.

7. A method for imaging or moving or actuating an object within a field-of-view, the method comprising:
    applying a magnetic pulse sequence to at least one array containing at least two electropermanent magnets to control generation of magnetic fields by the at least one array;
    varying a magnetic configuration of the array to produce magnetic profiles in the field-of-view that constitute a basis set for reconstructing an image of the object,
    wherein the magnetic profiles within the field-of-view have magnitudes that are non-linear with respect to position.

8. The method of claim 7, wherein at least some members of the basis set are orthogonal to one another.

9. The method of claim 7, wherein at least one of the magnetic profiles is non-linear with position along any direction within the field-of-view.

10. The method of claim 7, wherein the magnetic profiles propel, rotate or actuate at least one object in the field-of-view.

11. The method of claim 7, wherein the magnetic profiles are used to alter the direction of magnetization of the object.

12. The method of claim 7, wherein measurement of the magnetic profile in the field-of-view is used to select magnetization of electropermanent magnets in the at least one array.

13. A method for altering the magnetization angle of an object within a field-of-view with one or more electropermanent magnet arrays, the method comprising:
    applying a magnetic pulse sequence to at least one array containing at least two electropermanent magnets to control generation of magnetic fields by the at least one array;
    varying a magnetic configuration of the array to produce magnetic profiles in the field-of-view that constitute a basis set for reconstructing an image of the object,
    wherein the magnetic profiles within the field-of-view have magnitudes that are non-linear with respect to position.

14. The method of claim 13, wherein at least some members of the basis set are orthogonal to one another.

15. The method of claim 13, wherein at least one of the magnetic profiles is non-linear with position along any direction within the field-of-view.

16. The method of claim 13, wherein the magnetic profiles propel, rotate or actuate at least one object in the field-of-view.

17. The method of claim 13, wherein the magnetic profiles are used to alter the direction of magnetization of the object.

18. The method of claim 13, wherein measurement of the magnetic profile in the field-of-view is used to select magnetization of electropermanent magnets in the at least one array.

* * * * *